US006936806B1

(12) United States Patent
Kitamura et al.

(10) Patent No.: US 6,936,806 B1
(45) Date of Patent: Aug. 30, 2005

(54) PHOTOELECTRIC CONVERSION DEVICE AND SOLID-STATE IMAGE SENSING DEVICE USING THE SAME

(75) Inventors: Ken Kitamura, Nagaokakyo (JP); Yoshinori Hatanaka, Hamamatsu (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/704,539

(22) Filed: Nov. 3, 2000

(30) Foreign Application Priority Data

Nov. 5, 1999 (JP) ................................. 11-315194

(51) Int. Cl.[7] ........................ H01L 27/00; H01L 31/107
(52) U.S. Cl. ............................. 250/208.1; 250/214.1; 257/438
(58) Field of Search ........................ 250/208.1, 214 R, 250/214 A, 214 LA, 214.1; 257/55, 53, 185, 257/186, 438; 430/128; 348/294, 300, 301, 348/302

(56) References Cited

U.S. PATENT DOCUMENTS

| 4,496,981 | A | * | 1/1985 | Ota ............................ 348/294 |
| 4,980,736 | A | * | 12/1990 | Takasaki et al. ............... 257/55 |
| 5,122,431 | A | * | 6/1992 | Kodama et al. ............. 430/128 |
| 5,563,404 | A | * | 10/1996 | Anagnostopoulos ..... 250/208.1 |
| 5,635,327 | A | * | 6/1997 | Fukuda et al. .............. 430/128 |
| 5,869,851 | A | * | 2/1999 | Sugawa ....................... 257/186 |
| 6,064,091 | A | * | 5/2000 | Deane et al. ................ 257/347 |
| 6,077,752 | A | * | 6/2000 | Norstrom ..................... 438/309 |
| 6,157,072 | A | * | 12/2000 | Nakayama et al. ......... 257/443 |
| 6,476,867 | B1 | * | 11/2002 | Kobayashi et al. ......... 348/307 |

FOREIGN PATENT DOCUMENTS

| JP | 01-311511 | * | 12/1989 | ............ H01B 5/14 |
| JP | 9-102627 | | 4/1997 | |
| JP | 09-102627 | * | 4/1997 | ......... H01L 31/107 |

OTHER PUBLICATIONS

Kozuka et al., Translation of JP 09-102627, Apr. 15, 1997.*

* cited by examiner

Primary Examiner—Edward J. Glick
Assistant Examiner—Chih-Cheng Glen Kao
(74) Attorney, Agent, or Firm—McDermott Will & Emery LLP

(57) ABSTRACT

Disclosed is a photoelectric conversion device having a multiplying function and an image sensing device using the same. The photoelectric conversion device essentially comprises three layered structure: a carrier generation/multiplication layer composed of amorphous silicon to have both the function of absorbing light and generating carriers through optical excitation and the function of multiplying the generated carriers; an electron injection inhibiting layer composed of an amorphous silicon carbide of the p-type conductivity to inhibit injection of electrons into the carrier generation/multiplication layer; and a hole injection inhibiting layer composed of an amorphous silicon nitride of the n-type conductivity to inhibit injection of holes into the carrier generation/multiplication layer. The said carrier generation/multiplication layer is provided between said electron injection inhibiting layer and said hole injection inhibiting layer.

29 Claims, 9 Drawing Sheets

(Y-Y')

(X-X')

PHOTOELECTRIC CONVERSION DEVICE AND SOLID-STATE IMAGE SENSING DEVICE USING THE SAME

CROSS-REFERENCE TO RELATED APPLICATION

The present application is based on Japanese Patent Application No. 11-315194 filed on Nov. 5, 1999 in Japan, the entire content of which is hereby incorporated by reference.

BACKGROUND OF THE INVENTION

1. Field of the Invention

The present invention relates to photoelectric conversion device using amorphous silicon and to a solid-state image sensing device comprising the same. More particularly, it relates to a photoelectric conversion device having a photoelectric multiplying function.

2. Description of Related Art

In recent years, attention has been focused on photoelectric conversion devices using amorphous silicon. Amorphous silicon has excellent affinity with monocrystalline silicon which is in the mainstream of current IC technology and thermally stable. Amorphous silicon is also advantageous in that it can be formed into a film at a low temperature, into a film occupying a large area, and into diverse structures. An avalanche multiplication photodiode (APD) of reach-through type using the amorphous silicon has been proposed as a high-sensitivity photoelectric conversion device.

The reach-through APD has a structure in which a carrier generation layer for absorbing light and generating carriers through optical excitation and a carrier multiplication layer for multiplying the carriers generated in the carrier generation layer with the application of high electric field are formed separately. There has also been proposed a step-back structure which provides the carrier multiplication layer with a plurality of heterojunction portions to produce a level difference in band gap in each of the junction portions and causes one multiplication after another with the level differences in band gap.

However, since the carrier generation layer and the carrier multiplication layer exist separately in the reach-through structure, it assumes a complicated structure consisting of a large number of layers so that interfaces between the layers are increased. Since the interfaces are likely to suffer defects, the number of defects produced at the interfaces is larger as the number of interfaces is larger. In a photoelectric conversion device using an amorphous material, an interface defect may cause a dark current. This is because carriers are generated through an interface state density produced by the interface defect upon the application of an extremely high electric field, which should be applied to the multiplication layer in order to effect a phenomenon of avalanche multiplication. In a device with the step-back structure having a plurality of level differences in band gap in the carrier multiplication layer, the number of interfaces is particularly increased and the dark current resulting from the interface defect is increased notably. As a consequence, the reach-through APD using an amorphous material has not been used practically.

SUMMARY OF THE INVENTION

The present invention has been achieved in view of the foregoing problems and it is therefore an object of the present invention to provide an improved photoelectric conversion device and a solid-state image sensing device using the same.

Another object of the present invention is to provide a photoelectric conversion device having a carrier multiplying function and a reduced dark current and a high-sensitivity solid-state image sensing device with reduced noise.

To attain the objects, a photoelectric conversion device incorporating one aspect of the present invention has: a carrier generation/multiplication layer composed of amorphous silicon to have both the function of absorbing light and generating carriers through optical excitation and the function of multiplying the generated carriers; an electron injection inhibiting layer composed of an amorphous silicon carbide of the p-type conductivity to inhibit injection of electrons into the carrier generation/multiplication layer; and a hole injection inhibiting layer composed of an amorphous silicon nitride of the n-type conductivity to inhibit injection of holes into the carrier generation/multiplication layer. Here, the carrier generation/multiplication layer is provided between the electron injection inhibiting layer and the hole injection inhibiting layer. Hereinafter, the structure of these layers may be called "layered structure." The number of the layers of the layered structure, however, is not limited to three as understood from the following descriptions.

Unlike the reach-through type, the photoelectric conversion device performs the generation of carriers and the multiplication of the generated carriers by means of the single carrier generation/multiplication layer. Consequently, the number of layers is reduced and interface defects are also reduced, which results in a reduced dark current. Since the device comprises the electron injection inhibiting layer and the hole injection inhibiting layer to inhibit injection of electrons and holes from the outside into the carrier generation/multiplication layer, the carriers generated through, e.g., an interface state density resulting from interface defects adjacent the interface with the substrate are prevented from flowing as a current, so that the dark current is further reduced. This reduces the interface defects and suppresses the dark current, so that the resulting device has high sensitivity and reduced noise.

The composition ratio C/Si of the electron injection inhibiting layer, i.e., the amorphous silicon carbide layer of the p-type conductivity may be adjusted appropriately to 1.5 or lower. When the composition ratio is within this range, it is possible to provide the energy level at the interface between the amorphous silicon carbide layer and the amorphous silicon layer which is discontinued only on the conduction band side and equal on the valence band side. In other words, it is possible to prevent holes from flowing out of the carrier generation/multiplication layer, while preventing injection of electrons into the carrier generation/multiplication layer. As a result, holes as one type of carriers can be retrieved, while a dark current is suppressed.

On the other hand, the composition ratio N/Si of the hole injection inhibiting layer, i.e., the amorphous silicon nitride layer of the n-type conductivity may be adjusted appropriately to 0.8 or lower. When the composition ratio is within the range, it is possible to provide the energy level at the interface between the amorphous silicon nitride layer and the amorphous silicon layer which is discontinued only on the valence band side and equal on the conduction band side.

In other words, it is possible to prevent electrons from flowing out of the carrier generation/multiplication layer, while preventing injection of holes into the carrier generation/multiplication layer. As a result, electrons as the other type of carriers can be retrieved, while a dark current is suppressed.

The aforesaid layered structure may be formed appropriately on a surface of a substrate having at least the surface composed of polycrystalline silicon or microcrystalline silicon. The layered structure may also be formed on a surface of a substrate having at least the surface composed of monocrystalline silicon. It follows that the amorphous silicon carbide layer as the electron injection inhibiting layer or the amorphous silicon nitride layer as the hole injection inhibiting layer is formed on a silicon-based material having a thermal expansion coefficient close to that of the injection inhibiting layer. This prevents the peeling off of the injection inhibiting layer due to thermal expansion. This also facilitates planarization of a substrate surface and formation of the layers with equal thicknesses, so that an electric field is applied uniformly to the entire light-receiving surface of the carrier generation/multiplication layer. As a result, the electric field is prevented from being localized so that the efficiency of photoelectric conversion is equal at any portion of the carrier generation/multiplication layer.

The layered structure can also be formed on a surface of a substrate having at least the surface composed of a metal. This significantly facilitates planarization of a substrate surface and formation of the layers with equal thicknesses.

A small amount of boron may be introduced appropriately into the amorphous silicon layer as the carrier generation/multiplication layer to change the amorphous silicon into an intrinsic semiconductor. Although the amorphous silicon layer can be formed easily by plasma CVD using a monosilane gas, there is a case where the amorphous silicon layer is weakly charged to the n-type conductivity. In that case, a high electric field is localized between the electron injection inhibiting layer of the p-type conductivity and the carrier generation/multiplication layer upon the application of the high electric field so that the efficiency of carrier multiplication lowers. However, such a problem can be circumvented by introducing a small amount of boron into the carrier generation/multiplication layer and thereby providing a perfectly intrinsic semiconductor.

The device may also comprise an electric field reducing layer for reducing an electric field adjacent the layer interface, which is interposed between the carrier generation/multiplication layer and either or each of the electron injection inhibiting layer and the hole injection inhibiting layer. By reducing the electric field adjacent the layer interface having interface defects, a high electric field can be applied to the carrier generation/multiplication layer without incurring an increase in dark current.

To attain the foregoing objects, a solid-state image sensing device incorporating another aspect of the present invention has: a plurality of photoelectric conversion units each composed of the aforesaid photoelectric conversion device; a plurality of accumulation units for individually accumulating charges generated by the photoelectric conversion units; and an output unit for outputting the charges accumulated in the accumulation units. By thus constructing the device, sensitivity is enhanced by the carrier multiplying function of the photoelectric conversion units and a dark current is reduced, so that the resulting image sensing device has high sensitivity and reduced noise.

BRIEF DESCRIPTION OF DRAWINGS

These and other objects, advantages and features of the invention will become apparent from the following description thereof taken in conjunction with the accompanying drawings illustrating specific embodiments of the invention in which.

DETAILED DESCRIPTION OF THE PREFERRED EMBODIMENTS

A photoelectric conversion device and a solid-state image sensing device of the present invention will be described below with reference to some embodiments thereof.

Figure 1:
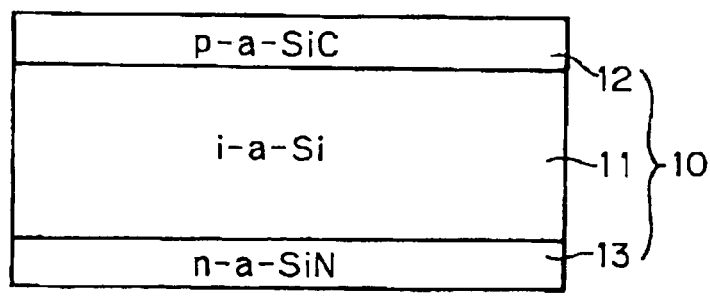
FIG. 1 is a cross-sectional view of a principal portion of a photoelectric conversion device of the present invention.

Prior to the description of the individual embodiments, a description will be given to a basic structure of the photoelectric conversion device of the present invention. In FIG. 1, a cross section of a principal portion of the photoelectric conversion device is shown diagrammatically. The photoelectric conversion device has a three-layered structure 10 consisting of: an intrinsic semiconductor layer 11 made of amorphous silicon; a p-type semiconductor layer 12 made of an amorphous silicon carbide; and an n-type semiconductor layer 13 made of an amorphous silicon nitride. Hereinafter, the amorphous silicon, the amorphous silicon carbide, and the amorphous silicon nitride will be abbreviated to a-Si, a-SiC, and a-SiN, respectively.

The intrinsic semiconductor layer 11 is a carrier generation/multiplication layer which absorbs light and generates carriers through optical excitation, while multiplying the generated carriers. Multiplication utilizes an avalanche phenomenon caused by the application of a high electric field. In silicon, an electron has a higher ionization rate than a hole so that, of the electrons and holes generated, the electrons are primarily ionized. The p-type semiconductor layer 12 is an electron injection inhibiting layer which inhibits injection of electrons into the carrier generation/multiplication layer 11. The n-type semiconductor layer 13 is a hole injection inhibiting layer which inhibits injection of holes into the carrier generation/multiplication layer 11.

The carrier generation/multiplication layer 11 is interposed between the electron injection inhibiting layer 12 and the hole injection inhibiting layer 13 to have one surface in contact with the electron injection inhibiting layer 12 and the other surface in contact with the hole injection inhibiting layer 13. A high electric field is applied in a reverse bias mode by regarding the n-type hole injection inhibiting layer 13 as a positive side and the p-type electron injection inhibiting layer 12 as a negative side.

The amorphous silicon can be formed into a film by plasma CVD using monosilane as a raw material gas. The amorphous silicon carbide can be formed into a film by plasma CVD using monosilane gas and methane or ethylene as a raw material gas, while the amorphous silicon nitride can be formed into a film by plasma CVD using monosilane and ammonia as a raw material gas. By changing film forming conditions including the composition ratio and flow rate ratio of the raw material gas, the composition ratios of the formed amorphous silicon carbide layer and the formed amorphous silicon nitride layer change, which allows control of a band gap in each of the layers.

Figure 2:
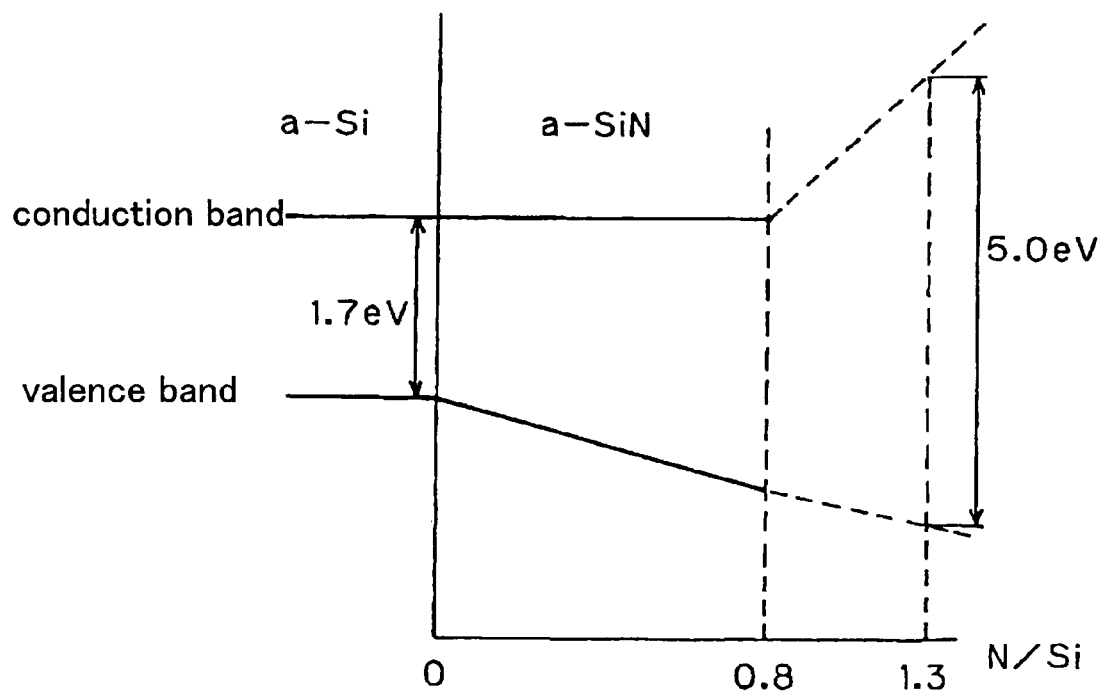
FIG. 2 is a view showing the relationship between the composition ratio N/Si of an amorphous silicon nitride and the band gap therein.

FIG. 2 shows the relationship between the composition ratio N/Si of the amorphous silicon nitride and the band gap therein. If the composition ratio N/Si is increased gradually from 0 corresponding to amorphous silicon, the band gap increases with the lowering of the energy level of a valence band till the composition ratio N/Si reaches 0.8. The energy level of the conduction band barely changes when the composition ratio is within the range. When the composition ratio N/Si exceeds 0.8, the energy level of the conduction band increases sharply, though a significant change is not observed in the lowering of the energy level of the valence band. When the composition ratio N/Si is 0, 0.8, and 1.3, the band gap is about 1.7, 2.8, and 5.0 eV, respectively.

The relationship between the composition ratio of the amorphous silicon carbide and the band gap therein shows a tendency opposite to that shown by the relationship in the amorphous silicon nitride. That is, if the composition ratio C/Si is increased from 0 corresponding to amorphous silicon, the band gap increases linearly with the rising of the energy level of the conduction band. When the composition ratio C/Si is in the range not higher than 1.5, the energy level of the valence band barely changes. When the composition ratio C/Si exceeds 1.5, a significant change is not observed in the rising of the energy level of the conduction band but the energy level of the valence band begins to lower. When the composition ratio C/Si is 1.5, the band gap is about 2.6 eV.

Based on such relationships between the composition ratios and the band gaps, the present embodiment assumes that the composition ratio C/Si of the electron injection inhibiting layer 12 made of the amorphous silicon carbide is 1.5 or lower and the composition ratio N/Si of the hole injection inhibiting layer 13 made of the amorphous silicon nitride is 0.8 or lower.

Figure 3:
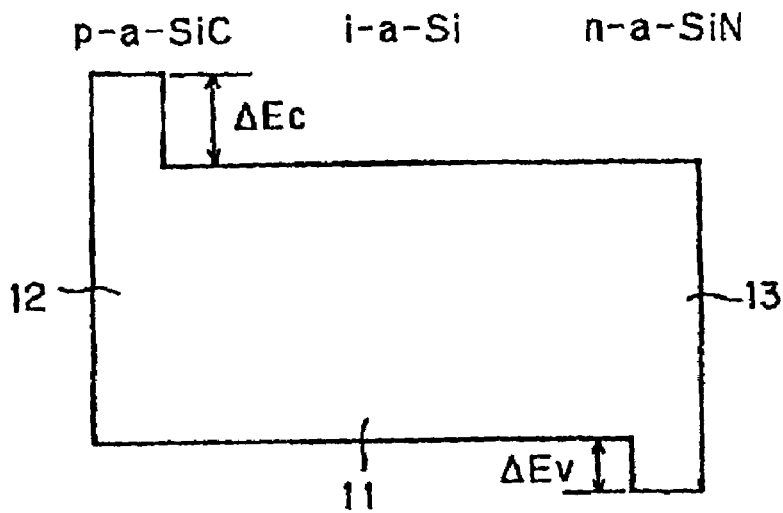
FIG. 3 is a view showing a band gap in the structure of FIG. 1 when an electric field is applied.

A band gap in the three-layer structure 10 when an electric field is applied is shown diagrammatically in FIG. 3. The band gap in the i-a-Si carrier generation/multiplication layer 11 and the band gap in the p-a-SiC electron injection inhibiting layer 12 have an energy level difference $\Delta Ec$ only on the conduction band side, while having no energy level difference on the valence band side. Conversely, the band gap in the i-a-Si carrier generation/multiplication layer 11 and the band gap in the n-a-SiN hole injection inhibiting layer 13 has an energy level difference $\Delta Ev$ only on the valence band side, while having no energy level difference on the conduction band side.

Figure 4:
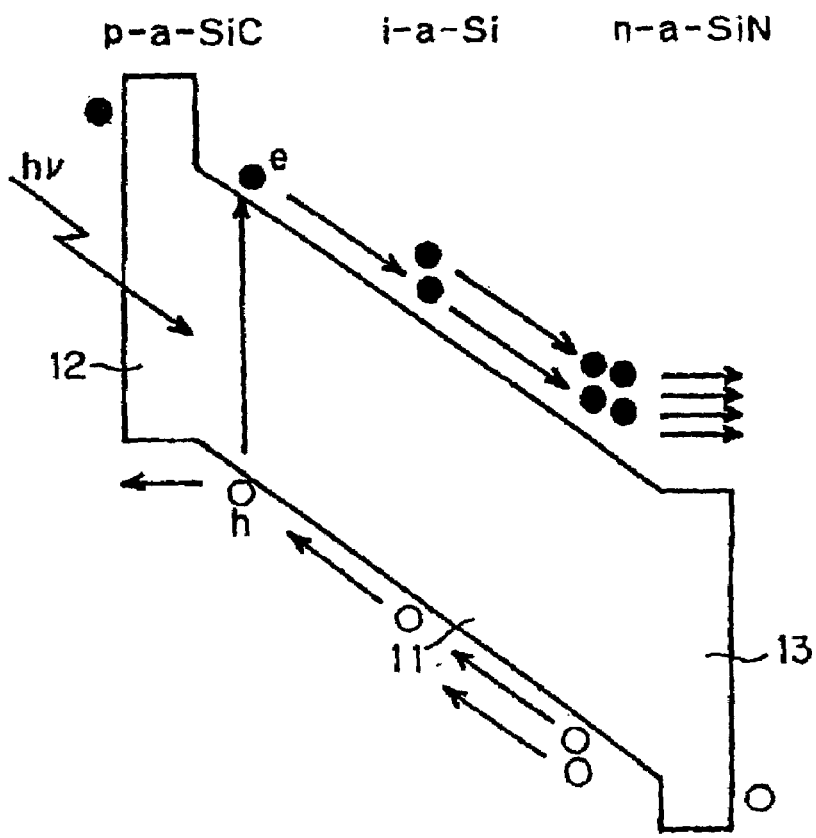
FIG. 4 is a view showing a band gap, carrier generation, and carrier multiplication in the structure of FIG. 1 when the electric field is applied.

A band gap in the three-layered structure 10 when a high electric field is applied is shown diagrammatically in FIG. 4. Electron-hole pairs are generated by light-induced excitation in the carrier generation/multiplication layer 11. Electrons e move toward the hole injection inhibiting layer 13, while being largely multiplied by repeatedly undergoing a phenomenon in which the electrons e are accelerated by an energy slope and ionized upon collision with lattice atoms. On the other hand, holes h move toward the electron injection inhibiting layer 12, while being barely ionized, because their ionization rate is lower than that of the electrons in silicon.

The electrons "e" that have reached the hole injection inhibiting layer 13 pass through the hole injection inhibiting layer 13 without being trapped by an energy level difference because there is no energy level difference on the conduction band side and without having their travel interrupted. The holes "h" that have reached the electron injection inhibiting layer 12 also pass through the electron injection inhibiting layer 12 without having their travel interrupted because there is no energy level difference on the valence band side. As a result, carriers generated and multiplied in the carrier generation/multiplication layer 11 are swiftly retrieved to the outside with no loss, so that the responsivity and photoelectric conversion efficiency of the three-layer structure 10 is high.

Of the carriers from the outside of the three-layer structure 10, the electrons are inhibited from being injected into the carrier generation/multiplication layer 11 by the energy level difference on the conduction band side and the holes are inhibited from being injected into the carrier generation/multiplication layer 11 by the energy level difference on the valence band side. As a consequence, the carriers from the outside are prevented from passing through the carrier generation/multiplication layer 11 and being multiplied. Eventually, only a current resulting from the carriers generated in the carrier generation/multiplication layer 11 flows through the photoelectric conversion device.

Since the carrier generation/multiplication layer 11 is composed of a high-quality single amorphous silicon layer with reduced defects, carriers will not be generated in a large quantity in the carrier generation/multiplication layer 11 by a factor other than light-induced excitation even if a high electric field is applied. Accordingly, a reduced dark current flows through the three-layer structure 10.

Figure 5:
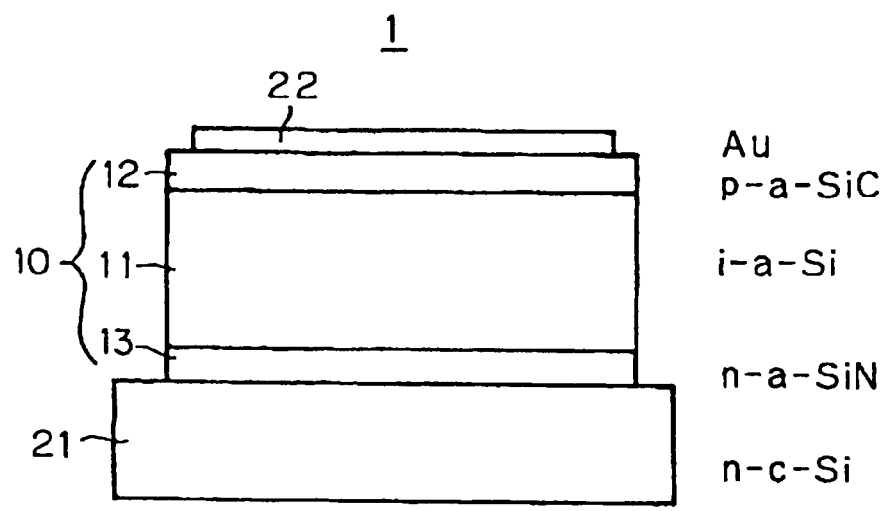
FIG. 5 is a cross-sectional view of a photoelectric conversion device of a first embodiment.

A cross section of a photoelectric conversion device 1 of the first embodiment is shown diagrammatically in FIG. 5. The photoelectric conversion device 1 is obtained by forming the three-layered structure 10 on a substrate 21 made of monocrystalline silicon. The silicon substrate 21 is of n-type and the n-a-SiN hole injection inhibiting layer 13 is in contact with the silicon substrate 21. A transparent electrode 22 made of gold (Au) is provided on the p-a-SiC electron injection inhibiting layer 12.

The following is a specific example of a method of fabricating the photoelectric conversion device 1. First, the n-type silicon substrate 21 is placed in a deposition chamber of a capacitively-coupled parallel-plate plasma CVD system and heated by a heater such that the temperature of the substrate 21 is increased to 250° C. Then, the deposition chamber is sufficiently vacuumed so that a silane gas diluted to 10% with hydrogen, an ammonia gas diluted to 10% with hydrogen, and a phosphine gas diluted to 1000 ppm with hydrogen are introduced into the deposition chamber at respective flow rates of 50 sccm, 15 sccm, and 50 sccm. After the pressure inside the deposition chamber is sufficiently stabilized at 30 Pa, an RF power of 50 W at 13.56 MHz is applied to a parallel-plate electrode to cause discharging, thereby forming the amorphous silicon nitride into a film. The discharging is halted after the lapse of a time when the film thickness reaches 50 nm, whereby the n-a-SiN hole injection inhibiting layer 13 is formed.

After the formation of the hole injection inhibiting layer 13, the raw material gas is exhausted such that the deposition chamber is sufficiently vacuumed. The substrate 21 is moved to another deposition chamber through a load-lock chamber that has been sufficiently vacuumed in advance without being exposed to an atmosphere. Then, a silane gas diluted to 0.10% with hydrogen is introduced into the deposition chamber at a flow rate of 50 sccm. After the pressure inside the deposition chamber is sufficiently stabilized at 30 Pa, discharging is caused with an RF power of 20 W, thereby forming the amorphous silicon into a film. The discharging is halted after the lapse of a time when a film thickness reaches 1 $\mu$m, whereby the i-a-Si carrier generation/multiplication layer 11 is formed.

After the formation of the carrier generation/multiplication layer 11, the raw material gas is exhausted such that the deposition chamber is sufficiently vacuumed. The substrate 21 is moved to still another deposition chamber through a load-lock chamber that has been sufficiently vacuumed in advance without being exposed to an atmosphere. Then, a silane gas diluted to 10% with hydrogen, an ethylene gas diluted to 20% with hydrogen, and a diborane gas diluted to 500 ppm with hydrogen are introduced into the deposition chamber at respective flow rates of 50 sccm, 50 sccm, and 50 sccm. After the pressure inside the deposition chamber is sufficiently stabilized at 30 Pa, discharging is caused with an RF power of 40 W, thereby forming the amorphous silicon carbide into a film. The discharging is halted after the lapse of a time when the film thickness reaches 50 nm, whereby the p-a-SiC electron injection inhibiting layer 12 is formed.

After the formation of the electron injection inhibiting layer 12, the substrate 21 is moved to a vapor deposition system so that an Au film with a thickness of 10 to 30 nm is vapor deposited on the electron injection inhibiting layer 12 to form the transparent electrode 22. Instead of forming the transparent electrode made of gold, an ITM film may be formed by sputtering or EB vapor deposition to serve as a transparent electrode.

As a result of optically measuring respective band gaps in the hole injection inhibiting layer 13, the carrier generation/multiplication layer 11, and the electron injection inhibiting layer 12 after the completion of the individual processes, they were about 2.0 eV, 1.7 eV, and 2.4 eV.

Figure 6:
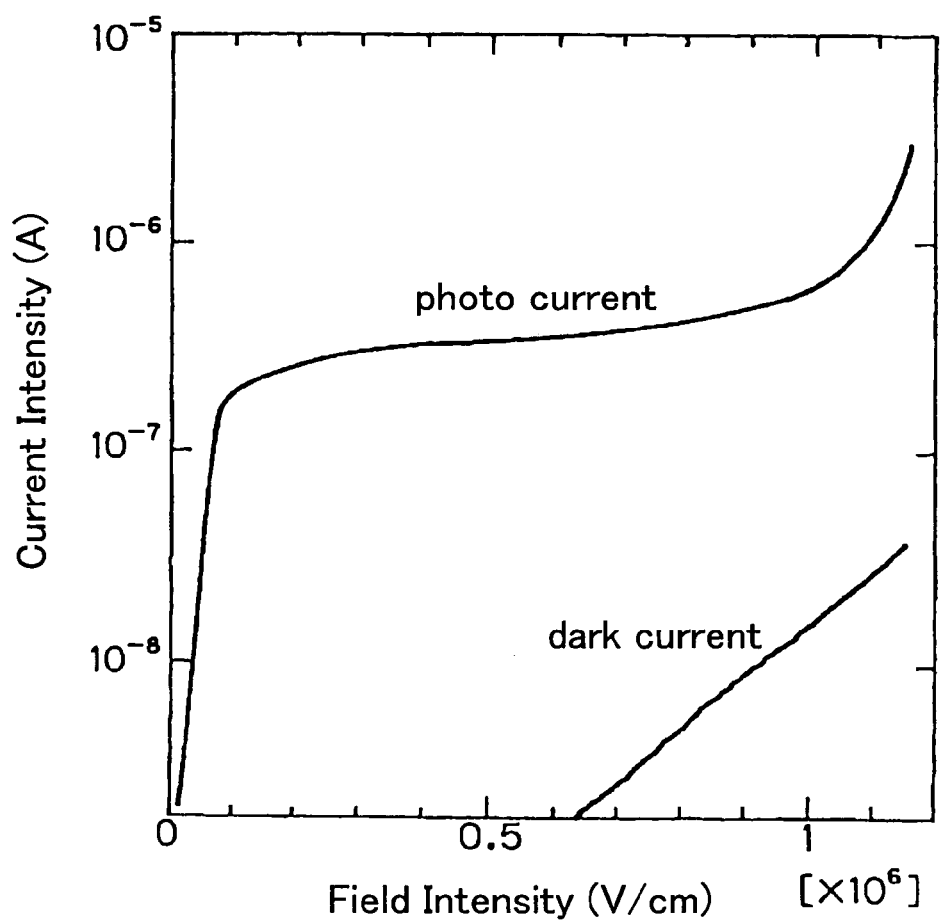
FIG. 6 is a graph showing the relationship between an applied electric field and a current in the photoelectric conversion device of the first embodiment.

The characteristics at a room temperature of the photoelectric conversion device 1 thus fabricated are shown in FIG. 6. The characteristics were obtained by measuring a current flowing through the device while varying the intensity of the electric field. For the measurement of the photoelectric current, an LED having a peak wavelength at 594 nm was used as a light source and the device was irradiated with light from the light source that has been changed into a luminous flux having a uniform intensity distribution in cross section via an irradiation optical system.

As shown in FIG. 6, the photoelectric current rises sharply when the intensity of the electric field exceeds 1 MV/cm. By further increasing the intensity of the electric field, a multiplication factor is increased about 10-fold. A dark current at the electric field intensity is 40 nA or less. Accordingly, it may be said that the photoelectric conversion device 1 features excellently low dark current properties.

Figure 7:
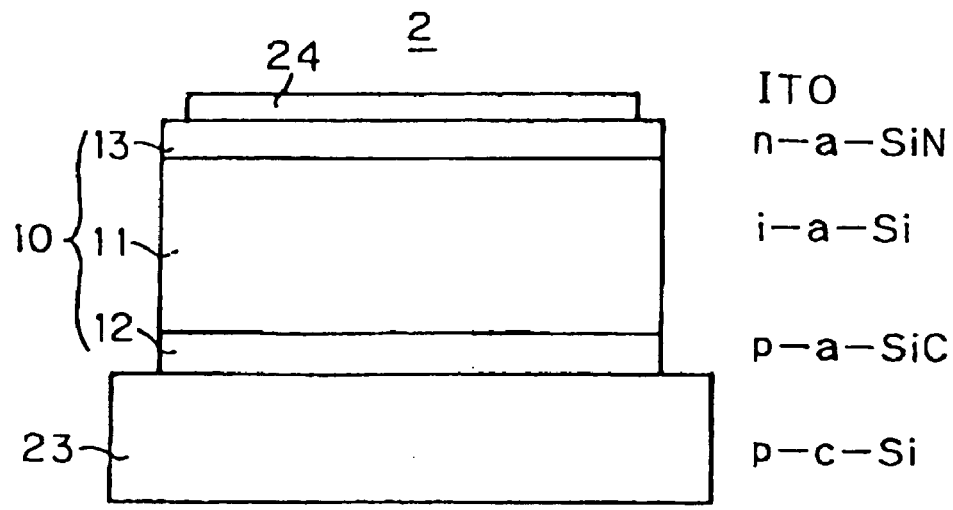
FIG. 7 is a cross-sectional view of a photoelectric conversion device of a second embodiment.

A cross section of a photoelectric conversion device 2 of a second embodiment is shown diagrammatically in FIG. 7. The photoelectric current conversion device 2 is formed by using a p-type monocrystalline silicon for a substrate 23 such that the p-a-SiC electron injection inhibiting layer 12 is in contact with the silicon substrate 23. A transparent electrode 24 made of ITO is provided on the n-a-SiN hole injection inhibiting layer 13.

The photoelectric conversion device 2 is fabricated by forming the electron injection inhibiting layer 12, the carrier generation/multiplication layer 11, the hole injection inhibiting layer 13, and the transparent electrode 24 in this order. Since only the order in which the layers are formed is different and the processes in the individual steps are the same as described in the example of the fabrication of the photoelectric conversion device 1, the overlapping description will be omitted.

The photoelectric conversion device 2 of the present embodiment can also be fabricated in a single-chamber plasma CVD system having only one deposition chamber. This is because, since the n-a-SiN hole injection inhibiting layer 13 is formed finally, there can be circumvented the degradation of the film qualities of the other layers due to an ammonia gas and a phosphine gas used during the film formation and remaining in the deposition chamber.

Figure 8:
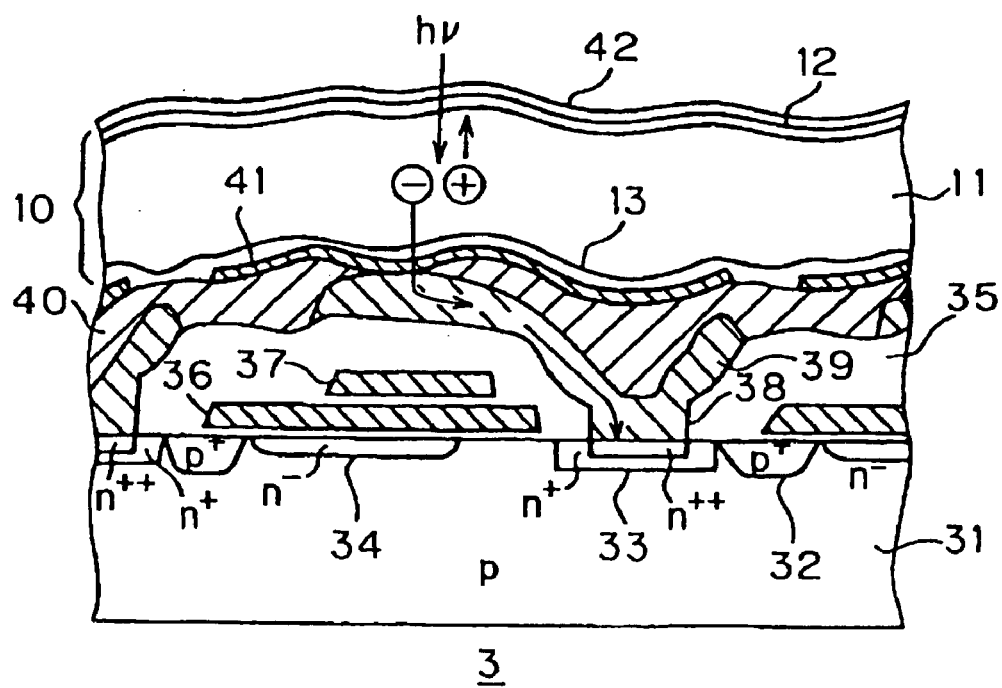
FIG. 8 is a cross-sectional view of a solid-state image sensing device of a third embodiment.

A cross section of a solid-state image sensing device 3 of a third embodiment is shown diagrammatically in FIG. 8. The solid-state image sensing device 3 is of CCD type and has the three-layered structure 10 as a photoelectric conversion unit provided on a multilayer structure. FIG. 8 indicates a range containing one pixel in the solid-state image sensing device 3.

The following is a specific example of a method of fabricating the solid-state image sensing device 3. First, a p$^+$-type device isolation region 32 is provided in the p-type silicon substrate 31 and an accumulation diode 33 composed of an n$^+$-type impurity region is formed in the area surrounded by the p$^+$-type device isolation region 32. An n-type channel region 34 of a vertical CCD is provided adjacent the accumulation diode 33. Subsequently, a first insulating film 35 is formed of a silicon oxide film over the entire top surface of the substrate 31. During the formation of the insulating film 35, transfer gate electrodes 36 and 37 are formed of polycrystalline silicon above the channel region 34 such that they are insulated from the surroundings by the insulating film 35. Then, a contact hole 38 is formed by photolithography in the insulating film 35 such that the accumulation diode 33 is exposed therein.

Next, an aluminum thin film is provided to extend from the accumulation diode 33 exposed in the contact hole 38 to reach a portion above the transfer gate electrodes 36 and 37, thereby forming a withdrawn electrode 39. Further, a second insulating film 40 is provided over the withdrawn electrode 39 and the insulating film 35 partly for surface planarization. The thickness of the insulating film 40 is controlled such that the top surface of the withdrawn electrode 39 is partially exposed. Thereafter, a titanium layer 41 with a thickness of 100 nm is formed by sputtering on the insulating film 40 and patterned by photolithography to form a lower electrode provided for each pixel.

The three-layered structure 10 is provided on such a structure and the transparent electrode 42 made of ITO is further provided thereon, whereby the solid-state image sensing device 3 is formed. The arrangement of the three-layered structure 10 is the same as in the photoelectric conversion device 1 of the first embodiment so that the n-a-SiN hole injection inhibiting layer 13 is in contact with the lower electrode 41 and the insulating film 40. The three-layered structure 10 and the transparent electrode 42 may be fabricated appropriately by the method described in the first embodiment.

Figure 9:
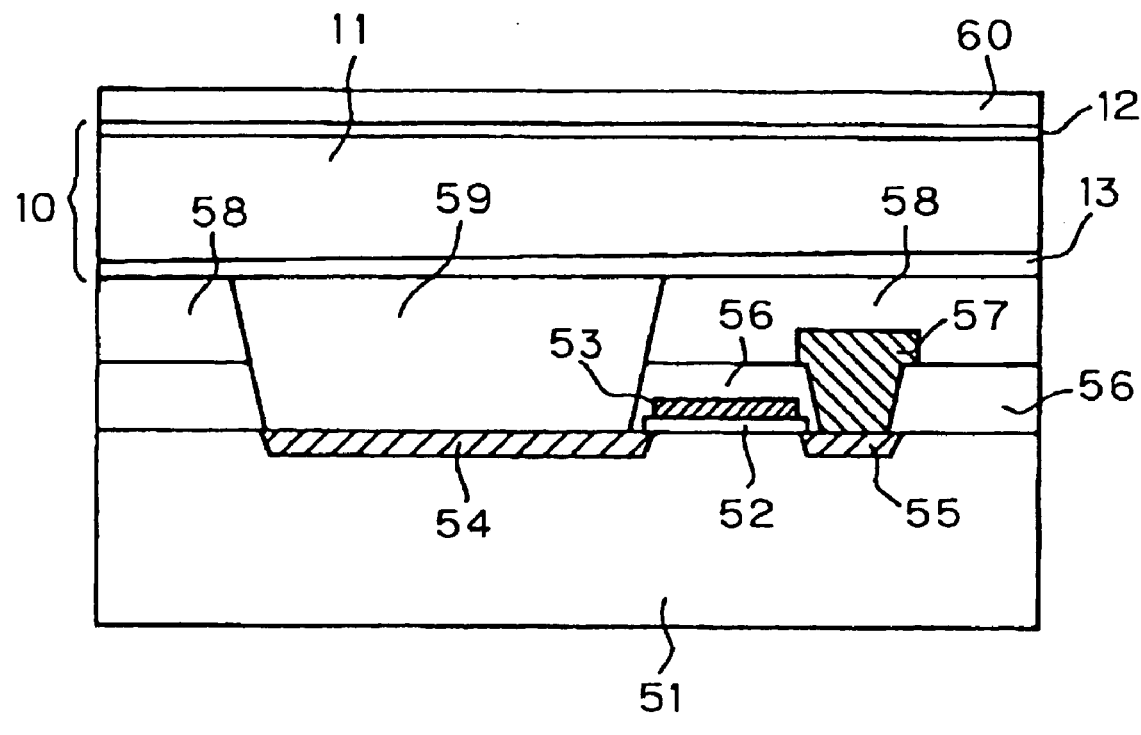
FIG. 9 is a cross-sectional view of a solid-state image sensing device of a fourth embodiment.

A cross section of a solid-state image sensing device 4 of a fourth embodiment is shown diagrammatically in FIG. 9. The solid-state image sensing device 4 is of MOS type and has the three-layer structure 10 as a photoelectric conversion unit provided on a semiconductor substrate formed with an NMOS device. FIG. 9 indicates a range for one pixel in the solid-state image sensing device 4.

The following is a specific example of a method of fabricating the solid-state image sensing device 4. First, an oxide film or a nitride film is formed on a p-type silicon substrate 51 and patterned so that a channel stopper and a field oxide film are formed by using the patterned oxide film or nitride film as a mask. Subsequently, the oxide film or nitride film in an active region is removed therefrom, a gate oxide film 52 is formed by thermal oxidation, and channel doping is performed by ion implantation.

Next, a polysilicon film is deposited by CVD and phosphorus is diffused therein to reduce the resistance. The polysilicon film is then patterned to form a polysilicon gate electrode 53. By implanting arsenic by ion implantation, a source region 54 and a drain region 55 are formed. During the ion implantation, the polysilicon gate electrode 53 serves as a mask so that overlapping portions between the gate and the source and drain are reduced significantly.

Subsequently, a first silicon oxide film 56 as an interlayer insulating film is deposited by CVD and patterned so that a contact hole is formed above the drain region 55 and then a wiring electrode 57 is provided. Thereafter, a second silicon oxide film 58 as an interlayer insulating film is deposited and a resist is coated thereon. Then, etching is performed by RIE under such conditions that etching rates for the resist and the silicon oxide film 58 are equal, thereby planarizing a surface of the silicon oxide film 58.

The silicon oxide films 56 and 58 overlying the source region 54 are further etched such that a contact hole is formed and a buried layer 59 is formed therein. The buried layer 59 is formed by depositing an n-type microcrystalline silicon with low resistance by CVD. Under such depositing conditions, microcrystalline silicon grows on the source region 54 made of a single crystal and amorphous silicon grows on the silicon oxide film 58. The deposition is continued till a surface of the buried layer becomes higher in level than a surface of the silicon oxide film 58 as the interlayer insulating film. Thereafter, the amorphous silicon of the silicon oxide film 58 is etched back, whereby the contact hole formed in the silicon oxide films 56 and 58 is filled with the microcrystalline silicon and a surface thereof becomes flush with the surface of the silicon oxide film 58.

The three-layer structure 10 is provided on the semiconductor substrate having a surface thus planarized and a transparent electrode 60 made of ITO is provided thereon, whereby the solid-state image sensing device 4 is formed. The arrangement of the three-layer structure 10 is the same as in the photoelectric conversion device 1 of the first embodiment so that the n-a-SiN hole injection inhibiting layer 13 is in contact with the buried layer 59 and the silicon oxide film 58. The three-layer structure 10 and the transparent electrode 60 may be fabricated appropriately by the method described in the first embodiment.

Figure 10A:
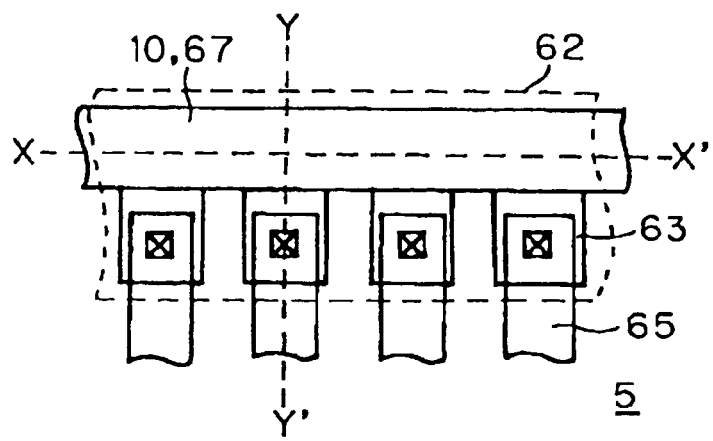
FIGS. 10(a) to 10(c) are views each showing a structure of a solid-state image sensing device of a fifth embodiment.
Figure 10B:
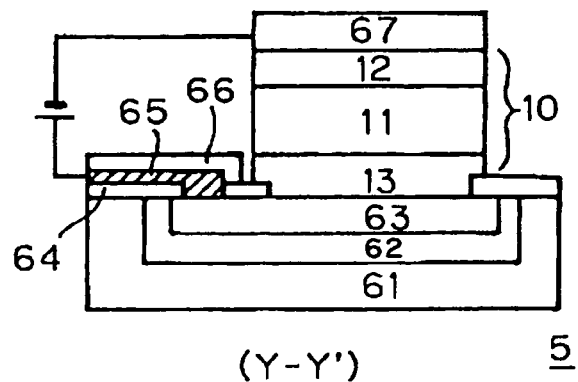
Figure 10C:
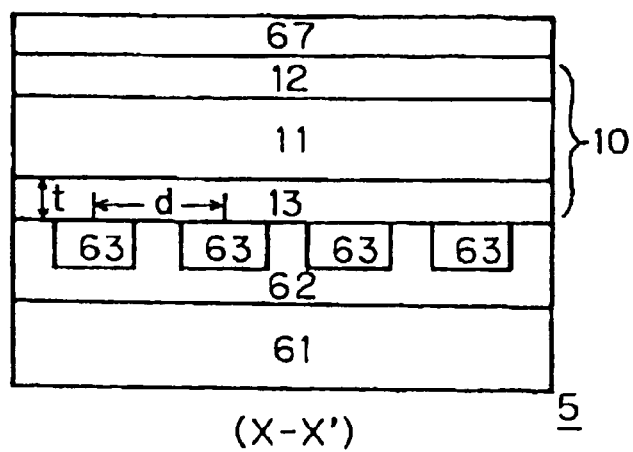

A structure of a solid-state image sensing device 5 of a fifth embodiment is shown diagrammatically in FIGS. 10(a) to 10(c). FIG. 10(a) is a plan view indicating a range containing four pixels. FIG. 10(b) is a cross-sectional view taken along the line Y-Y' of FIG. 10(a). FIG. 10(c) is a cross-sectional view taken along the line X-X' of FIG. 10(a). The solid-state image sensing device 5 is obtained by providing the three-layered structure 10 as a photoelectric conversion unit on a semiconductor substrate having a flat surface, while omitting the provision of a lower electrode for separating the pixels.

The following is a specific example of a method of fabricating the solid-state image sensing device 5. First, a p-type well region 62 is formed in an n-type silicon substrate 61 by ion implantation or thermal diffusion and an n-type impurity diffusion layer 63 is formed within the well region 62 by ion implantation or thermal diffusion. A silicon oxide film is provided over the entire surface of the substrate 61 to form an insulating film 64 and a contact hole is formed therein by removing a portion of the insulating film 64 corresponding to an end portion of the impurity diffusion layer 63.

Then, an electrode 65 is formed of aluminum by sputtering, which is then patterned and sintered. Thereafter, a silicon oxide film is provided on the electrode film 65 to serve as an insulating film 66 and a contact hole is formed therein by removing the majority of the impurity diffusion layer 63 and a portion of the insulating film 66 corresponding to the well region 62.

The three-layer structure 10 is provided over the contact hole and a transparent electrode 67 made of ITO is provided thereon, whereby the solid-state image sensing device 5 is formed. The arrangement of the three-layered structure 10 is the same as in the photoelectric conversion device 1 of the first embodiment so that the n-a-SiN hole injection inhibiting layer 13 is in contact with the impurity diffusion layer 63 and the well region 62. The three-layered structure 10 and the transparent electrode 67 may be fabricated appropriately by the method described in the first embodiment.

Light incident from the transparent electrode 67 is absorbed by the i-a-Si carrier generation/multiplication layer 11 to form electron-hole pairs. An electric field has been applied by regarding the electrode 65 as a positive side and the transparent electrode 67 as a negative side so that holes move toward the transparent electrode 67 and electrons move toward the n-type impurity diffusion layer 63. The electrons are retrieved via the impurity diffusion layer 63 and the electrode 65. A detection circuit such as a CCD analog register or a logarithmic conversion circuit has been connected to the electrode 65, though it is not depicted, so that the drawn electrons are detected as a photoelectric current.

Since the pixels are separated by the impurity diffusion layer 63 in the solid-state image sensing device 5, there is no need to provide a lower electrode that has been provided conventionally. In addition, the impurity diffusion layer 63 has been formed within the well region 62 such that the n-a-SiN hole injection inhibiting layer 13 is in direct contact with the n-type impurity diffusion layer 63 and with the p-type well region 62. Moreover, the respective surfaces of the impurity diffusion layer 63 and the well region 62 are even. As a consequence, the solid-state image sensing device 5 is free from the problem observed in a conventional multilayer solid-state image sensing device that an electric field becomes nonuniform due to an uneven underlie of a photoelectric conversion layer, which causes variations in sensitivity.

The pixels are defined by the impurity diffusion layer 63 in the solid-state image sensing device 5. As shown in FIG. 10(c), the three-layered structure 10 extends over a plurality of pixels. However, since the i-a-Si carrier generation/multiplication layer 11 has high resistance and a pixel-to-pixel distance d is long compared with the thickness t of the hole injection inhibiting layer 13 in the lowermost portion of the three-layered structure 10, electrons generated and multiplied in the carrier generation/multiplication layer 11 reach the impurity diffusion layer 63 via the hole injection inhibiting layer 13 without being laterally diffused. Accordingly, a crosstalk barely occurs between the pixels. Specifically, the thickness "t" of the hole injection inhibiting layer 13 is about 1 to 3 μm and the pixel-to-pixel distance d is about 10 to 20 μm.

Figure 11:
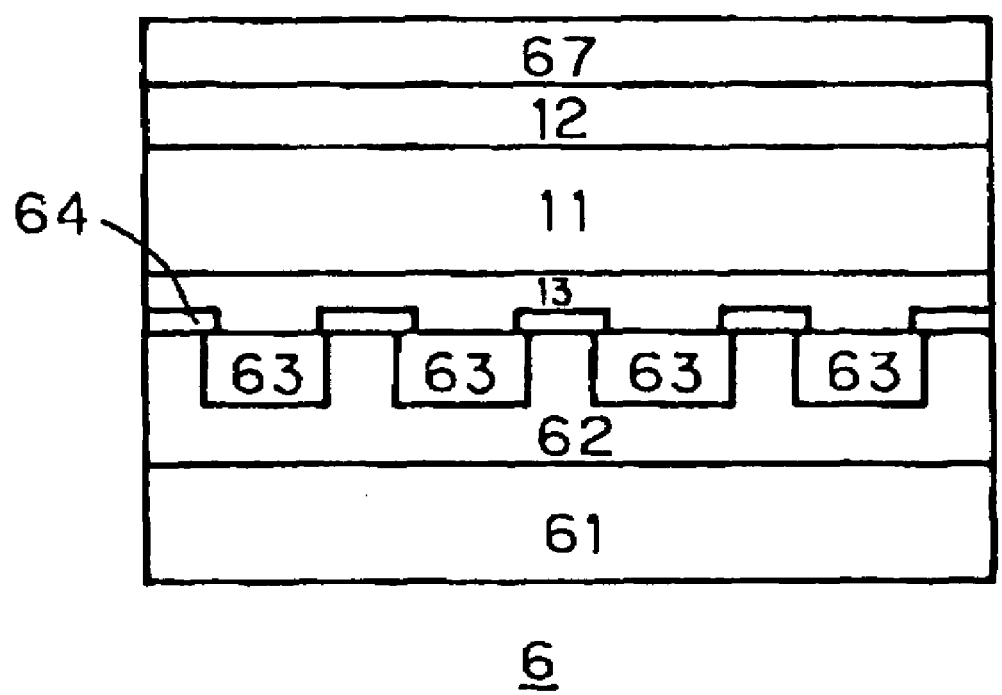
FIG. 11 is a cross-sectional view of a solid-state image sensing device of a sixth embodiment.

A cross section of a solid-state image sensing device of a sixth embodiment is shown diagrammatically in FIG. 11. The solid-state image sensing device 6 is obtained by modifying the aforementioned solid-state image sensing device 5 and leaving the insulating film 64 also on the portions of the well region 62 interposed between the impurity diffusion layers 63 defining the pixels. The hole injection inhibiting layer 13 is in contact with only the impurity diffusion layer 63 so that a contact area between the hole injection inhibiting layer 13 and the impurity diffusion layer 63 is also smaller than in the solid-state image sensing device 5. This further reduces the crosstalk between the pixels.

Figure 12A:
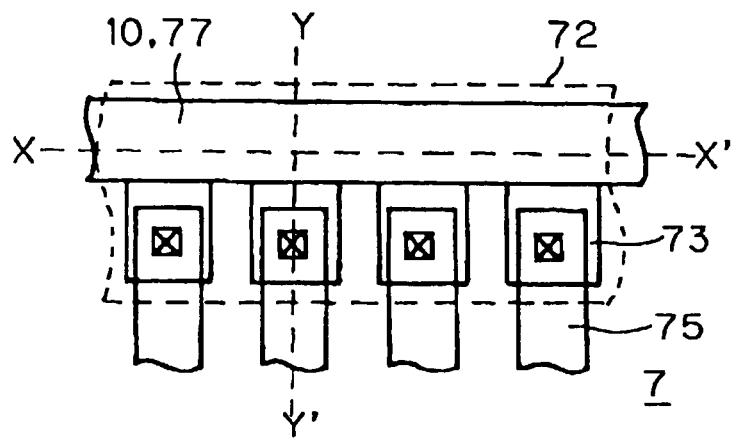
FIGS. 12(a) to 12(c) are views each showing a structure of a solid-state image sensing device of a seventh embodiment.
Figure 12B:
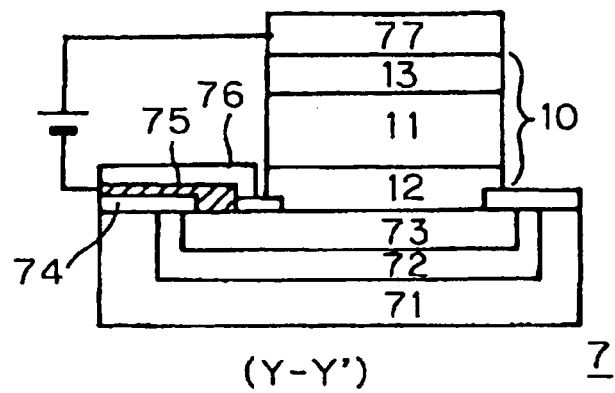
Figure 12C:
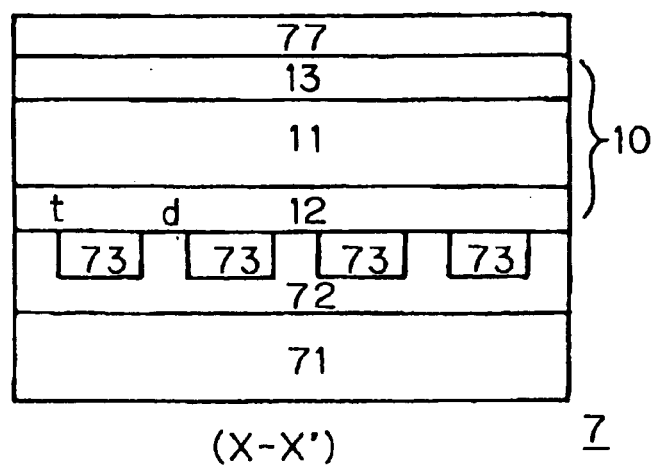

A structure of a solid-state image sensing device 7 of a seventh embodiment is shown diagrammatically in FIGS. 12(a) to 12(c). FIG. 12(a) is a plan view indicating a range containing four pixels. FIG. 12(b) is a cross-sectional view taken along the line Y-Y' of FIG. 12(a). FIG. 12(c) is a cross-sectional view taken along the line X-X' of FIG. 12(a). The solid-state image sensing device 7 is obtained by reversing the conductivity types of the individual portions of the solid-state image sensing device 5 of the fifth embodiment.

71 denotes a p-type silicon substrate, 72 denotes an n-type well region, 73 denotes a p-type impurity diffusion layer, 74 and 76 denote insulating films, 75 denotes an electrode of aluminum, and 77 denotes a transparent electrode of ITO. The individual layers of the three-layered structure 10 are provided in the order reverse from that in the solid-state image sensing device 5 such that the p-a-SiC electron injection inhibiting layer 12 is in contact with the p-type impurity diffusion layer 73 and the n-type well region 72. In the solid-state image sensing device 7, therefore, an electric field is applied by regarding an electrode 75 as a negative side and a transparent electrode 77 as a positive side.

Figure 13:
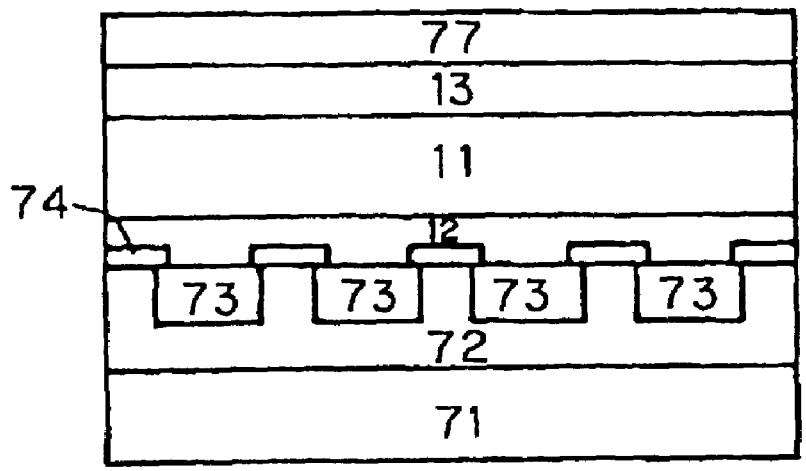
FIG. 13 is a cross-sectional view of a solid-state image sensing device of an eighth embodiment.

A cross section of a solid-state image sensing device 8 of an eighth embodiment is shown diagrammatically in FIG. 13. The solid-state image sensing device 8 is obtained by modifying the aforementioned solid-state image sensing device 7, similarly to the solid-state image sensing device 6 of the sixth embodiment which has been obtained by modifying the solid-state image sensing device 5. That is, an insulating film 74 is left on the well region 72 such that the electron injection inhibiting layer 12 is in contact with only an impurity diffusion layer 73.

Figure 14:
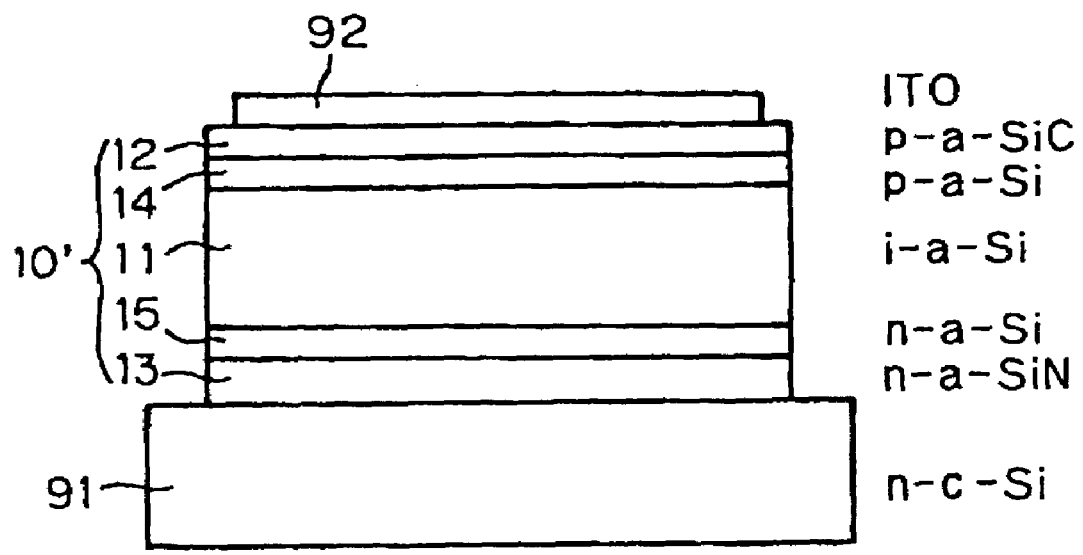
FIG. 14 is a cross-sectional view of a photoelectric conversion device of a ninth embodiment.

A cross section of a photoelectric conversion device 9 of a ninth embodiment is shown diagrammatically in FIG. 14. The photoelectric conversion device 9 of the present embodiment is obtained by providing an electric field reducing layer for reducing an electric field adjacent the interface between the carrier generation/multiplication layer 11 and each of the electron injection inhibiting layer 12 and the hole injection inhibiting layer 13. An electric field reducing layer 14 made of p-type amorphous silicon is provided between the i-a-Si carrier generation/multiplication layer 11 and the p-a-SiC electron injection inhibiting layer 12. An electric field reducing layer 15 made of n-type amorphous silicon is provided between the i-a-Si carrier generation/multiplication layer 11 and the n-a-SiN hole injection inhibiting layer 13. Hence, the photoelectric conversion device 9 has a five-layered structure 10'.

Except for the two additional electric field reducing layers 14 and 15, the photoelectric conversion device 9 has the same structure as the photoelectric conversion device 1 of the first embodiment. That is, the hole injection inhibiting layer 13 is formed on an n-type monocrystalline silicon substrate 91 and a transparent electrode 92 is formed on the electron injection inhibiting layer 12. The transparent electrode 92 is made of ITO.

The following is a specific example of a method of fabricating the photoelectric conversion device 9. First, the hole injection inhibiting layer 13 is formed on the substrate 91 in accordance with the method described in the first embodiment. After the formation of the hole injection inhibiting layer 13, a silane gas diluted to 10% with hydrogen and a phosphine gas diluted to 1000 ppm with hydrogen are introduced into a deposition chamber at respective flow rates of 50 sccm and 5 sccm. After the pressure inside the deposition chamber is sufficiently stabilized at 30 Pa, discharging is caused with an RF power of 20 W, thereby forming the n-type amorphous silicon into a film serving as the electric field reducing layer 15.

The introduction of the phosphine gas is halted after the lapse of time when the film thickness reaches 50 nm and a diborane gas diluted to 1000 ppm with hydrogen is introduced into the deposition chamber at a flow rate of 0.1 sccm, while the introduction of the silane gas and the discharging is continued, whereby intrinsic amorphous silicon is formed into a film serving as the carrier generation/multiplication layer 11.

After the lapse of time when the film thickness reaches 1 μm, the flow rate of the diborane gas is increased to 5 sccm, while the discharging is continued, so that the p-type amorphous silicon is formed into a film serving as the electric field reducing layer 14. The discharging is halted after the lapse of time when the film thickness reaches 50 nm.

Thereafter, the electron injection inhibiting layer 12 is formed in accordance with the method described in the first embodiment and a transparent electrode 92 of ITO is formed thereon.

With the provision of the electric field reducing layers 14 and 15, the photoelectric conversion device 9 can reduce the electric field adjacent the interface between the carrier generation/multiplication layer 11 and the electron injection inhibiting layer 12 or the hole injection inhibiting layer 13. By reducing the electric field around the portion with a large number of defects, it becomes possible to apply a high electric field to the carrier generation/multiplication layer 11 without incurring an increase in dark current. Moreover, since the film formation for the electric field reducing layer 15, the carrier generation/multiplication layer 11, and the electric field reducing layer 14 is performed continuously while the discharging is continued, the formation of distinct interfaces between the carrier generation/multiplication layer 11 and the electric field reducing layers 14 and 16 is circumvented so that the production of interface defects is suppressed. Consequently, there is no increase in dark current due to an increase in the number of layers.

In general, it is known that amorphous silicon formed into a film by using only a monosilane gas has a tendency to be weakly charged to the n-type conductivity. If the carrier generation/multiplication layer 11 is weakly charged to the n-type conductivity, an electric field is likely to be localized between the carrier generation/multiplication layer 11 and the p-type electric field reducing layer 14. The diborane gas is added during the film formation for the carrier generation/multiplication layer 11 in order to introduce a small amount of borane into silicon being deposited and thereby change generated amorphous silicon into an intrinsic semiconductor, which avoids the localization of the electric field.

In particular, since the n-type electric field reducing layer 15 is provided in the photoelectric conversion device 9 and the film formation is performed continuously for the electric field reducing layer 15 and for the carrier generation/multiplication layer 11, the carrier generation/multiplication layer 11 is likely to be charged to the n-type conductivity because of remaining phosphine. The addition of the diborane gas to the raw material gas for the carrier generation/multiplication layer 11 allows continuous film formation for the electric field reducing layer 15 and for the carrier generation/multiplication layer 11.

The ratio of the amount of the diborane gas and the amount of the silane gas in the raw material gas is appropriately on the order of $B_2H_6/SiH_4 = 10^-$ to $10^{-4}$. The addition of the diborane gas to the raw material gas in the film formation for the carrier generation/multiplication layer 11 is also applicable to a structure in which the electric field reducing layers 14 and 15 are not provided, such as the photoelectric conversion device 1 of the first embodiment and is particularly useful when an intrinsic layer is formed after the formation of an n-type layer in a single-chamber CVD system.

Although the present embodiment has provided the respective electric field reducing layers between the carrier generation/multiplication layer 11 and the electron injection inhibiting layer 12 and between the carrier generation/multiplication layer 11 and the hole injection inhibiting layer 13, it is also possible to omit the provision of one of the electric field reducing layers and provide only the electric field reducing layer 14 or the electric field reducing layer 15. Alternatively, the individual layers of the five-layer structure 10' may be provided in the reverse order by forming a p-type silicon substrate 91.

Although the present invention has been fully described by way of examples with reference to the accompanying drawings, it is to be noted that various changes and modifications will be apparent to those skilled in the art. For example, rendering the energy level of the electron injection inhibiting layer equal to that of a valence band in the carrier generation/multiplication layer and rendering the energy level of the hole injection inhibiting layer and that of a conduction band in the carrier generation/multiplication layer is also useful in a structure in which carriers are multiplied by a mechanism other than the avalanche phenomenon. The photoelectric conversion device of the present invention is also applicable to a solid-state image sensing device other than a CCD type and an NMOS type, e.g., an apparatus comprising a device such as a SIT or bipolar transistor. Therefore, unless otherwise such changes and modifications depart from the scope of the present invention, they should be construed as being included therein.

What is claimed is:

1. A photoelectric conversion device having a layered structure, said layered structure comprising:

a carrier generation/multiplication layer composed of amorphous silicon to have both the function of absorbing light and generating carriers through optical excitation and the function of multiplying the generated carriers;

an electron injection inhibiting layer composed of an amorphous silicon carbide of p-type conductivity to inhibit injection of electrons into the carrier generation/multiplication layer; and a hole injection inhibiting layer composed of amorphous silicon nitride of n-type conductivity to inhibit injection of holes into the carrier generation/multiplication layer, wherein said carrier generation/multiplication layer is provided between said electron injection inhibiting layer and said hole injection inhibiting layer, and an energy level at an interface between said amorphous silicon nitride layer and said amorphous silicon layer is discontinued on a valance band side and equal on a conduction band side.

2. The photoelectric conversion device as claimed in claim 1, wherein a composition ratio N/Si of said hole injection inhibiting layer is adjusted appropriately to 0.8 or lower.

3. The photoelectric conversion device as claimed in claim 1, wherein the amorphous silicon nitride of n-type conductivity is hydrogenated amorphous silicon nitride of n-type conductivity.

4. The photoelectric conversion device as claimed in claim 1, wherein said carrier generation/multiplication layer is prevented from holes flowing out thereof and is prevented from electron injection thereto, and a composition ratio C/Si of said electron injection inhibiting layer is adjusted appropriately to 1.5 or lower.

5. The photoelectric conversion device as claimed in claim 4, wherein said layered structure is formed on a surface of a substrate having at least said surface composed of polycrystalline silicon.

6. The photoelectric conversion device as claimed in claim 4, wherein said layered structure is formed on a surface of a substrate having at least said surface composed of microcrystal line silicon.

7. The photoelectric conversion device as claimed in claim 4, wherein said layered structure is formed on a surface of a substrate having at least said surface composed of monocrystalline silicon.

8. The photoelectric conversion device as claimed in claim 4, wherein said layered structure is formed on a surface of a substrate having at least said surface composed of a metal.

9. The photoelectric conversion device as claimed in claim 4, wherein a small amount of boron is introduced into said carrier generation/multiplication layer.

10. The photoelectric conversion device as claimed in claim 4, wherein said layered structure consists of said carrier generation/multiplication layer, said electron injection inhibiting layer, and said hole injection inhibiting layer.

11. The photoelectric conversion device as claimed in claim 4, wherein the amorphous silicon nitride of n-type conductivity is hydrogenated amorphous silicon nitride of n-type conductivity.

12. The photoelectric conversion device as claimed in claim 1, wherein said layered structure further comprises an electric field reducing layer for reducing an electric field adjacent an interface between said carrier generation/multiplication layer and said electron injection inhibiting layer.

13. The photoelectric conversion device as claimed in claim 1, wherein
said layered structure further comprises an electric field reducing layer for reducing an electric field adjacent an interface between said carrier generation/multiplication layer and said hole injection inhibiting layer.

14. A photoelectric conversion device having a layered structure, said layered structure comprising:
a carrier generation/multiplication layer composed of amorphous silicon to have both the function of absorbing light and generating carriers through optical excitation and function of multiplying the generated carriers;
an electron injection inhibiting layer composed of an amorphous silicon carbide of p-type conductivity to inhibit injection of electrons into the carrier generation/multiplication layer; and
a hole injection inhibiting layer composed of amorphous silicon nitride of n-type conductivity to inhibit injection of holes into the carrier generation/multiplication layer, wherein
said carrier generation/multiplication layer is provided between said electron injection inhibiting layer and said hole injection inhibiting layer,
an energy level at an interface between said amorphous silicon nitride layer and said amorphous silicon layer is discontinued on a valance band side and equal on a conduction band side, and
said carrier generation/multiplication layer is prevented from electrons flowing out thereof and is prevented from hole injection thereto.

15. The photoelectric conversion device as claimed in claim 14, wherein a composition ratio N/Si of said hole injection inhibiting layer is adjusted appropriately to 0.8 or lower.

16. The photoelectric conversion device as claimed in claim 14, wherein the amorphous silicon nitride of n-type conductivity is hydrogenated amorphous silicon nitride of n-type conductivity.

17. A solid-state image sensing device comprising:
a plurality of photoelectric conversion units, each photoelectric conversion unit having a layered structure and including:
a carrier generation/multiplication layer composed of amorphous silicon to have both the function of absorbing light and generating carriers through optical excitation and the function of multiplying the generated carriers, said carrier generation/multiplication layer being a single layer;
an electron injection inhibiting layer composed of an amorphous silicon carbide of p-type conductivity to inhibit injection of electrons into the carrier generation/multiplication layer; and
a hole injection inhibiting layer composed of amorphous silicon nitride of n-type conductivity to inhibit injection of holes into the carrier generation/multiplication layer, wherein
said carrier generation/multiplication layer is provided between said electron injection inhibiting layer and said hole injection inhibiting layer, and
an energy level at an interface between said amorphous silicon carbide layer and said amorphous silicon layer is discontinued on a conduction band side and equal on a valence band side;

a plurality of accumulation units for respectively accumulating charges generated by said photoelectric conversion units; and
an output unit for outputting the charges accumulated in said accumulation units.

18. The solid-state image sensing device as claimed in claim 17, wherein said layered structure consists of said carrier generation/multiplication layer, said electron injection inhibiting layer, and said hole injection inhibiting layer.

19. The solid-state image sensing device as claimed in claim 17, wherein the amorphous silicon nitride of n-type conductivity is hydrogenated amorphous silicon nitride of n-type conductivity.

20. A photoelectric conversion device having a layered structure, said layered structure comprising:
a substrate layer;
a hole injection inhibiting layer formed on only said substrate;
a carrier generation/multiplication layer formed on said hole injection inhibiting layer; and
an electron injection inhibiting layer formed on said carrier generation/multiplication layer; wherein
said carrier generation/multiplication layer is composed of an amorphous silicon to have both the function of absorbing light and generating carriers through optical excitation and the function of multiplying the generated carriers,
said hole injection inhibiting layer is composed of amorphous silicon nitride of n-type conductivity to inhibit injection of holes into the carrier generation/multiplication layer,
said electron injection inhibiting layer is composed of an amorphous silicon carbide of p-type conductivity to inhibit injection of electrons into the carrier generation/multiplication layer, and
an energy level at an interface between said amorphous silicon nitride layer and said amorphous silicon layer is discontinued on a valance band side and equal on a conduction band side.

21. The photoelectric conversion device as claimed in claim 20, wherein the amorphous silicon nitride of n-type conductivity is hydrogenated amorphous silicon nitride of n-type conductivity.

22. A solid-state image sensing device comprising:
a plurality of photoelectric conversion units, each photoelectric conversion unit including:
a substrate;
a hole injection inhibiting layer formed on only said substrate;
a carrier generation/multiplication layer formed on said hole injection inhibiting layer; and
an electron injection inhibiting layer formed on said carrier generation/multiplication layer; wherein
said carrier generation/multiplication layer is composed of an amorphous silicon to have both the function of absorbing light and generating carriers through optical excitation and the function of multiplying the generated carriers,
said hole injection inhibiting layer is composed of amorphous silicon nitride of n-type conductivity to inhibit injection of holes into the carrier generation/multiplication layer,
said electron injection inhibiting layer is composed of an amorphous silicon carbide of p-type conductivity to inhibit injection of electrons into the carrier generation/multiplication layer, and an energy level at an interface between said amorphous silicon nitride layer and said amorphous silicon layer is discontinued on a valance band side and equal on a conduction band side;

a plurality of accumulation units for respectively accumulating charges generated by said photoelectric conversion units; and an output unit for outputting the charges accumulated in said accumulation units.

23. The solid-state image sensing device as claimed in claim 22 wherein the amorphous silicon nitride of n-type conductivity is hydrogenated amorphous silicon nitride of n-type conductivity.

24. A solid-state image sensing device comprising:

a plurality of photoelectric conversion units, each photoelectric conversion unit including:

a carrier generation/multiplication layer composed of amorphous silicon to have both the function of absorbing light and generating carriers through optical excitation and the function of multiplying the generated carriers;

an electron injection inhibiting layer composed of an amorphous silicon carbide of p-type conductivity to inhibit injection of electrons into the carrier generation/multiplication layer; and a hole injection inhibiting layer composed of amorphous silicon nitride of n-type conductivity to inhibit injection of holes into the carrier generation/multiplication layer, wherein said carrier generation/multiplication layer is provided between said electron injection inhibiting layer and said hole injection inhibiting layer;

a plurality of accumulation units for respectively accumulating charges generated by said photoelectric conversion units; and an output unit for outputting the charges accumulated in said accumulation units, wherein said carrier generation/multiplication layer is prevented from holes flowing out thereof and is prevented from electron injection thereto, and an energy level at an interface between said amorphous silicon nitride layer and said amorphous silicon layer is discontinued on a valance band side and equal on a conduction band side.

25. The solid-state image sensing device as claimed in claim 24, wherein a composition ratio C/Si of said electron injection inhibiting layer is adjusted appropriately to 1.5 or lower.

26. The solid-state image sensing device as claimed in claim 24, wherein the amorphous silicon nitride of n-type conductivity is hydrogenated amorphous silicon nitride of n-type conductivity.

27. A solid-state image sensing device comprising:

a plurality of photoelectric conversion units, each photoelectric conversion unit having a layered structure and including:

a carrier generation/multiplication layer composed of amorphous silicon to have both the function of absorbing light and generating carriers through optical excitation and the function of multiplying the generated carriers;

an electron injection inhibiting layer composed of an amorphous silicon carbide of p-type conductivity to inhibit injection of electrons into the carrier generation/multiplication layer; and a hole injection inhibiting layer composed of amorphous silicon nitride of n-type conductivity to inhibit injection of holes into the carrier generation/multiplication layer, wherein said carrier generation/multiplication layer is provided between said electron injection inhibiting layer and said hole injection inhibiting layer;

a plurality of accumulation units for respectively accumulating charges generated by said photoelectric conversion units; and an output unit for outputting the charges accumulated in said accumulation units, wherein said carrier generation/multiplication layer is prevented from electrons flowing out thereof and is prevented from hole injection thereto, and an energy level at an interface between said amorphous silicon nitride layer and said amorphous silicon layer is discontinued on a valance band side and equal on a conduction band side.

28. The solid-state image sensing device as claimed in claim 27, wherein a composition ration N/Si of said hole injection inhibiting layer is adjusted appropriately to 0.8 or lower.

29. The solid-state image sensing device as claimed in claim 27, wherein the amorphous silicon nitride of n-type conductivity is hydrogenated amorphous silicon nitride of n-type conductivity.

* * * * *